United States Patent [19]

Yamamoto et al.

[11] Patent Number: 5,043,784
[45] Date of Patent: Aug. 27, 1991

[54] IMAGE SENSOR WITH MULTILAYERED AMORPHOUS SILICON CONTACT

[75] Inventors: Kenji Yamamoto, Miyagi; Yusuke Tanno, Yamamoto; Hiroshi Miura, Natori; Hideo Watanabe, Ogawara, all of Japan

[73] Assignees: Ricoh Company, Ltd., Tokyo; Ricoh Research Institute of General Electronics Co., Ltd., Natori; Tohoku Ricoh Co., Ltd., Miyagi, all of Japan

[21] Appl. No.: 566,313

[22] Filed: Aug. 13, 1990

Related U.S. Application Data

[63] Continuation of Ser. No. 307,268, Feb. 7, 1989, abandoned.

[30] Foreign Application Priority Data

Feb. 8, 1988 [JP] Japan .................................. 63-28337
Mar. 22, 1988 [JP] Japan .................................. 63-65823

[51] Int. Cl.⁵ .................... H01L 27/14; H01L 31/00; H01L 45/00
[52] U.S. Cl. .......................................... 357/30; 357/2
[58] Field of Search ........................................ 357/30, 2

[56] References Cited

U.S. PATENT DOCUMENTS

| | | | |
|---|---|---|---|
| 4,027,323 | 5/1977 | Lorenze, Jr. et al. | 357/30 |
| 4,137,543 | 1/1979 | Beneking | 357/30 |
| 4,365,107 | 12/1982 | Yamauchi | 136/258 |
| 4,371,890 | 1/1983 | Anagnostopoulos et al. | 357/59 |
| 4,403,239 | 9/1983 | Yamazaki | 357/30 |
| 4,460,670 | 6/1984 | Ogawa et al. | 430/57 |
| 4,633,284 | 12/1986 | Hansell et al. | 357/23.7 |
| 4,636,829 | 1/1987 | Greenwood et al. | 357/30 |
| 4,739,178 | 4/1988 | Nobue | 250/578 |

Primary Examiner—Andrew J. James
Assistant Examiner—Stephen D. Meier
Attorney, Agent, or Firm—Oblon, Spivak, McClelland, Maier & Neustadt

[57] ABSTRACT

An image sensor having a lower electrode disposed on a surface of a substrate; a multilayered amorphous silicon layer formed on the surface of the substrate so as to cover an end portion of the lower electrode; and an upper electrode formed on the surface of the substrate so as to cover an end portion of the amorphous silicon layer. An angle defined by an end surface of the end portion of the amorphous silicon layer and the surface of the substrate having the lower electrode disposed thereon is within a range of from 30° to 60° and a distance between edges of two neighboring layers of the amorphous silicon layer at the end portion of the amorphous silicon layer is equal to or less than 500Å.

16 Claims, 6 Drawing Sheets

IMAGE SENSOR WITH MULTILAYERED AMORPHOUS SILICON CONTACT

This application is a continuation of application Ser. No. 07/307,268, filed on Feb. 7, 1989, now abandoned.

BACKGROUND OF THE INVENTION

The present invention relates to an amorphous silicon image sensor, and, more particularly, to a contact type amorphous silicon image sensor. A contact type amorphous silicon image sensor is constituted by a photosensor array which comprises: a lower electrode vapored deposited on the upper surface of a transparent substrate; an a-Si film (amorphous silicon film) with a multilayered structure which covers one end portion of the lower electrode; a transparent conductive film covering the uppermost surface of the amorphous silicon film; and an upper electrode vapor deposited on the transparent substrate in such a manner that this upper electrode covers one end portion of the transparent electrode. This photosensor array is covered with a transparent insulating film which serves as a protection layer.

DISCUSSION OF THE BACKGROUND

An a-Si film generally formed by a plasma CVD method and having its photoabsorption peak in a visible region is extremely preferable for use as a photodiode sensor.

However, the conventional image sensor having the above-described sandwich type structure shown, for example, in Japanese Patent Laying Open (KOKAI) No. 58-111366 has the disadvantages that a disconnection of the upper electrode and a defective step coverage of the transparent insulating film frequently occur for the reason that a relatively large step portion is formed at the edge of the a-Si film since the angle defined by the edge of the a-Si film and the upper surface of the transparent substrate is substantially 90° or more (overhang) and an alignment error occurs at the edge of each layer which forms the a-Si film. In addition, since the angle defined by the edge of an end portion of the lower electrode and the upper surface of the transparent substrate (called "edge angle" hereinafter) is from 80° to 90°, or 90° or more, that is, in an overhang state, there is no substantial growth of the film at the above-described edge of the lower electrode when such a-Si film is formed. Therefore, a disadvantage is that a gap or nonuniform structure portion may be generated in the a-Si film.

If such a gap or nonuniform structure portion is present in the a-Si film, a current leak can pass between the upper electrode and the lower electrode via water which has entered the gap or the nonuniform structure portion in the a-Si film when a voltage is applied, under wet conditions, to the thus-obtained a-Si type photodiode. As a result, the noise signals from the sensor can be adversely enlarged. Even if the a-Si type photodiode sensor is not used in the above-described wet condition, the noise signals can also be enlarged due to the slight amount of residual etchant, which is used when performing necessary patternings, left in the gap or the nonuniform structure portion in the a-Si film.

SUMMARY OF THE INVENTION:

Therefore, an object of the present invention is to provide an image sensor in which the shape of the edge of the multilayered amorphous silicon film is controlled whereby the generation of a disconnection of the upper electrode and the defective step coverage of the transparent insulating film can be prevented.

The above-described object can be achieved by an image sensor comprising, (a) a lower electrode disposed on a surface of a substrate; (b) a multilayered amorphous silicon layer comprising 2 or more neighboring layers formed on said surface of said substrate so as to cover an end portion of said lower electrode; and (c) an upper electrode formed on said surface of said substrate so as to cover an end portion of said amorphous silicon layer, wherein the angle defined by the end surface of said end portion of said amorphous silicon layer and said surface of said substrate having the lower electrode disposed thereon is within a range of from 30° to 60° and the distance between the edges of any two neighboring layers of said amorphous silicon layer at said end portion of said amorphous silicon layer is equal to or less than 500 Å.

Further objects and advantages of the present invention will be apparent from the following description of the preferred embodiment and examples of the invention as illustrated in the accompanying drawings.

DETAILED DESCRIPTION OF THE PREFERRED EMBODIMENTS

Figure 1A:
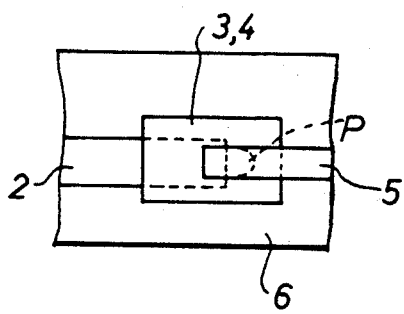
FIGS. 1a and 1b illustrate a conventional a-Si type image sensor.
Figure 1B:
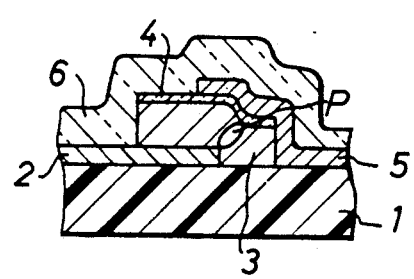
Figure 2A:
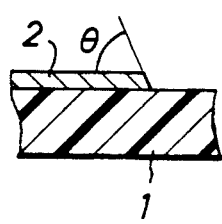
FIGS. 2a to 2d illustrate a process in which an a-Si film grows in the course of time on a lower electrode formed on a substrate, this lower electrode having a preferred edge angle $\theta$.
Figure 2B:
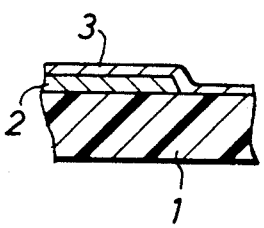
Figure 2C:
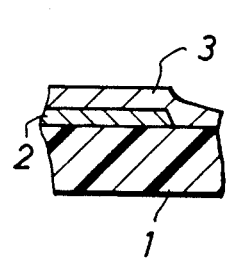
Figure 2D:
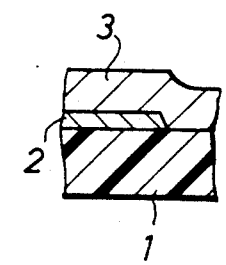

Prior to the description of an embodiment of the present invention, a conventional image sensor will now be described with reference to FIG. 1. A conventional a-Si image sensor is, as shown in FIGS. 1a and 1b, structured in such a manner that: a lower electrode 2 is formed on a substrate (glass substrate or the like) 1; an a-Si film 3 is formed at an end portion of this lower electrode 2; a transparent conductive film 4 is formed on this a-Si film 3; and an upper electrode 5 is formed on this transparent conductive film 4 so as to correspond to the lower electrode 2. In addition, a transparent insulating film 6 is formed on the photodiode sensor array having the above-described structure.

Hitherto, since the patterning of the lower electrode 2 is performed by a wet etching method in which ion reactions are utilized or an anisotropic dry etching method in which radical reactions are utilized, the edge angle of the lower electrode 2 is caused to be from 80° to 90° or in an overhang state. Therefore, if the a-Si film 3 is formed on the lower electrode 2 having the above-described edge angle by the plasma CVD method, the growth of the film at the edge of the lower electrode 2 is excessively prevented, causing a portion having a gap or a crack (p) to be adversely produced in the region extending from the edge of the lower electrode 2 to the surface of the film on the thus-formed a-Si film 3.

The present invention will now be further in detail described with reference to the drawings.

FIGS. 2a to 2d illustrate the steps of a process in which the a-Si film 3 is formed (accumulated) as time elapses by the plasma CVD method on the substrate 1 (glass, quartz, insulating high polymer resin or the like) on whose surface lower electrode 2 having the edge angle ($\theta$) of from 15° to 45° has been formed. This lower electrode 2 is subjected to a patterning by an isotropy dry etching method so as to have the edge angle $\theta$ of from 15° to 45°. When the a-Si film 3 is growed on the lower electrode 2 having the edge angle $\theta$ of from 15° to 45° which has been formed on the substrate 1, the growth of this a-Si film 3 at the edge of the lower electrode 2 can be obtained. Therefore, the portion having the gap or the crack (p) shown in FIGS. 1a and 1b, cannot be produced in the thus-formed a-Si film 3.

The break or disconnection of the upper electrode 5 can be prevented and an excellent step coverage of the transparent insulating film 6 can be achieved by further forming the amorphous silicon layer 3 so as to have an edge angle $\theta$ of from 30° to 60° by the isotropic dry etching method.

Next, each layer which forms the contact type image sensor according to the present invention will be described with reference to FIGS. 3a, 3b, and 3c.

As the transparent substrate 1, glass, quartz, insulating high polymer resin or the like may be employed. As the lower electrode 2, a thin metal film of Cr, Mo, Ni, Ti or Co may be employed. As the amorphous silicon layer 3, a multilayered amorphous silicon hydride (a-Si:H), amorphous silicon hydride containing oxygen (a-Si:O:H), or amorphous silicon hydride containing Group III atoms, i.e., B, Al, Ga, In, etc., may be employed. As the transparent conductive film 4, ITO, $SnO_2$, $In_2O_2$, or $TiO_2$ may be employed. As the upper electrode 5, a monometal thin film of Al, Ni, or Pt, or an alloy thin film of Al-Si-Cu, for example, may be employed. As the transparent, insulating layer 6, $NaAlF_6$, $SiO_2$, $Si_3N_4$, SiON, polyimide or epoxy insulating resin coating may be employed.

Next, a manufacturing method of forming a taper at the end portion of the lower electrode 2 and the amorphous silicon layer 3 respectively will be described.

A reactive ion etching method (abbreviated to "RIE" method hereinafter) is employed to separate the lower electrode 2 into a multiplicity of elements. The RIE method is usually used as a manufacturing method for forming a vertical shape since this RIE method can perform an anisotropic etching. The inventors found a method of tapering the end portion by using the anisotropic etching. This method is such that the photoresist is etched faster compared to the material of the lower electrode by setting an etching condition so that the selection ratio of the material of the lower electrode is small with respect to the photoresist, as a result of which the surface of the lower electrode is allowed to expose during the etching. As a result, the end shape is tapered. By employing the above-described method and by selecting the etching condition, a desired end inclination can be obtained with excellent reproducibility.

Next, the specific method of etching the lower electrode 2 will be described.

As the material of the lower electrode 2, for example, Cr is employed. As the etching gas, $CCl_4$, $O_2$, or $CO_2$ is used. If a gas obtained by mixing $CCl_4$ and $O_2$ is used, although the etching rate of the photoresist tends to be increased in accordance with the increase in the flow ratio of oxygen in the mixture gas, the etching rate of Cr is substantially constant. In this case, the selection ratio with respect to the resist (Cr etching rate/resist etching rate) is changed from 1.2 to 0.6. The resist is also etched anisotropically together with Cr.

Therefore, by controlling the flow ratio of $CCl_4$ to $O_2$, the angle of inclination of the end portion of Cr can be widely controlled.

Furthermore, by controlling the gas pressure and the applied high frequency electricity used at the time of etching, the selection ratio with respect to the photoresist can also be changed. The inventors found that when the gas pressure is from 0.01 to 0.2 (Torr), the selection ratio with respect to the photoresist is changed from 0.2 to 1.0 and that when the applied high frequency electricity is from 200 to 500 (W), the selection ratio with respect to the photoresist is changed from 1.2 to 1.5.

The etching conditions shown in Table 2 are selected as the conditions in each of which the angle of inclination of the end portion of Cr can be formed within the range of from 10° to 60° with excellent reproducibility.

Next, the method of separating the amorphous silicon layer 3 into a multiplicity of elements will now be described.

The image sensor according to the present invention preferably employs, in order to realize excellent sensitivity and a high speed response, a triple layered structure as the amorphous silicon layer 3. This triple layered structure is formed by individual materials such as:

P+ a-Si:O:H / a-Si:O:H / a-Si:H

In the RIE method, oxide type materials are generally used as the masking material, causing the etching rate to be excessively lowered with respect to that of the silicon type materials in usual etching conditions. Therefore, if usual etching conditions are employed when the amorphous silicon layer having the above-described type structure is etched, the end portion of this amorphous silicon layer has an overhang state in which the a-Si:O:H or P+ a-Si:O:H juts out. A smoothly tapered shape can be obtained at the end portion of the amorphous silicon layer by the following manner similar to the above-described method of etching the lower electrode: Etching is performed anisotropically under an etching condition such that the selection ratio of the amorphous silicon with respect to the photoresist is small so that the resist is etched allowing the amorphous silicon layer allowed to be exposed in the mean time.

A specific method of etching the amorphous silicon layer will now be described.

When the amorphous silicon layer is intended to be etched, $CF_4$, $SF_6$, $O_2$ gas or the like is used as the etching gas. In a case where the mixture gas of $CF_4 + SF_6 + O_2$ is used, the greater the flow ratio of $SF_6$ with respect to that of $CF_4$, the greater the etching rate of the amorphous silicon layer becomes, provided that the flow of $O_2$ is made constant. Accordingly, the selection ratio with respect to the resist becomes greater, and the shape of the end portion of the amorphous silicon layer approximates the perpendicular (90°) shape. If the flow ratio of $SF_6$ is further increased, the quantity of the radical which is produced during the process of the reaction is increased. As a result, the etching changes from the anisotropic etching to the isotropic etching, which increases the etching rate difference between a-Si:O:H Si:O:H and a-Si:H, and the shape of the end portion of the P+ a-Si:O:H / a-Si:O:H becomes an eaves-like shape. On the other hand, provided that the flow of $CF_4$ and $SF_6$ is made constant, and the flow of $O_2$ is increased, the etching rate of the resist becomes greater in proportion to the increase of flow of $O_2$. As a result, the selection ratio of the amorphous silicon layer with respect to the resist is reduced, so that the amorphous silicon is anisotropically etched as well as the resist, and the angle of inclination at the end portion becomes small.

Therefore, by properly selecting the flow ration of $CF_4$, $SF_6$, and $O_2$, a smooth tapered shape can be realized with an excellent reproducibility.

The conditions of etching the amorphous silicon shown in Table 3 are selected so as to control the angle of inclination at the end portion to be within a range of from 25° to 70° with an excellent reproducibility.

Figure 4:
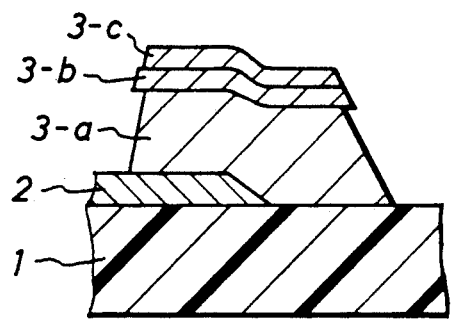
FIGS. 4 and 5 illustrate the end portion of an amorphous silicon layer.
Figure 5:
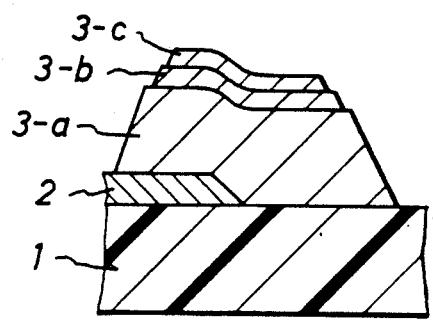

The preferred amorphous silicon layer according to the present invention is a triple layered structure or double layered structure comprising P+a-Si:O:H, a-Si:O:H, a-Si:H, wherein the a-Si:O:H contains oxygen atoms by 10 to 50 (atm %) in a-Si:H, while P+a-Si:O:H contains B atoms which are Group III atoms by substantially $10^{-5}$ to 5 (atom %), preferably $10^{-4}$ to $10^{-1}$ (atom %) in a-Si:O:H. As a result, since the etching rate for each of the materials is different relative to each other in the method according to the present invention in which the same etching gas is used to the above-described individual types of materials and these individual type materials are simultaneously subjected to the etching, the shape of the end portion of the amorphous silicon after it has been etched becomes as shown in FIGS. 4 and 5. In general, the material such as $SiO_2$ is used as a masking material in the RIE dry etching process. Therefore, the shape of the end portion of the amorphous silicon layer substantially becomes as shown in FIG. 4 when the a-Si:O:H type material and a-Si:H type material which are similar to $SiO_2$ are etched under the usual etching conditions since the etching rate of a-Si:O:H is small than that of a-Si:H layer. As shown in FIG. 4, the a-Si:O:H layer 3-b and the P+a-Si:O:H layer 3-c jut out to form an eaves-like shape. In this case, a horizontal distance between the respective end faces of any two neighboring layers among the a-Si:O:H layer 3-b, P+a-Si:O:H layer 3-c, and a-SiH layer 3-a exceeds 500 Å, a disconnection or break in the aluminium which is used for wiring the end portion of the amorphous silicon layer will occur at the portion where the p+a-Si:O:H or a-Si:O:H layer juts out. In order to prevent such a disconnection of the aluminium, a horizontal distance between an end face of a-Si:O:H / P+a-Si:O:H layer and an end face of the a-S:H layer, and the a-Si:O:H layer should be less than 200 Å, preferably less than 100 Å. It is preferable to form the structure by selecting an etching gas and an etching pressure properly, in which the P+a-SiO:H layer, a-Si:O:H layer and a Si:H layer form a step-like shape as shown in FIG. 5. In this case, the horizontal distance between the respective end faces of any two neighboring layers among the a-Si:O:H layer, P+a-Si:O:H layer, and a-Si:H layer needs to be 500 Å or less. In the above-described conditions of etching the amorphous silicon layer, each of the etching rates for P+-a-Si:O:H layer, a-Si:O:H layer and a-Si:H layer is substantially the same and the resist is easily etched compared to the amorphous silicon layer. Therefore, the etching rate of the P+a-Si:O:H layer and a-Si:O:H layer disposed immediately below the resist becomes greater than that of a-Si:H layer, as a result, the end shape as shown in FIG. 5 can be obtained in which each distance between the horizontal distance between the respective ed faces of any two neighboring layers among the P+a-Si:O:H layer, a-Si:O:H layer and a-Si:H layer is 500 Å or less. The angle of inclination of the amorphous silicon layer with respect to the substrate is substantially 25°, and a satisfactory shape for the purpose of improving the step coverage and preventing the disconnection can be obtained.

Figure 3A:
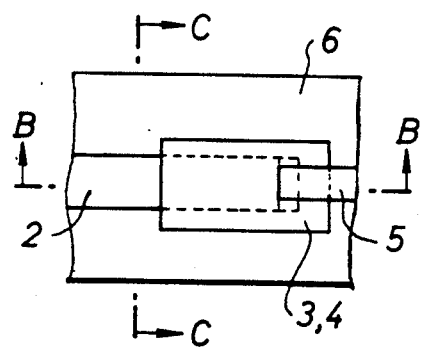
FIGS. 3a, 3b, and 3c illustrate an essential portion of a sensor according to the present invention.
Figure 3B:
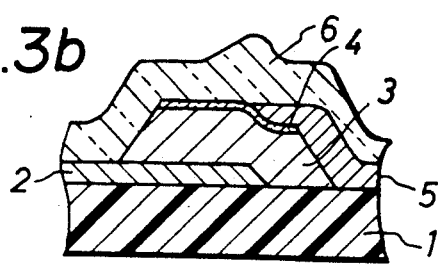
Figure 3C:
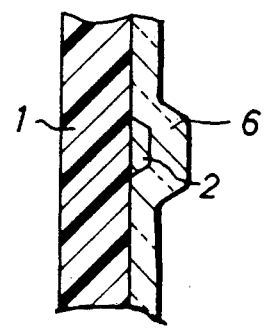

FIGS. 3a, 3b, and 3c illustrate the most preferred type of a-Si type image sensor according to the present invention. FIG. 3a is a plan view of the same, FIG. 3b is a cross-sectional view taken along line B—B in FIG. 3a, and FIG. 3c is a cross-sectional view taken along line C—C in FIG. 3a.

The image sensor according to the present invention comprises a multiplicity of the structures shown in FIGS. 3a, 3b and 3c which are arranged and integrated. According to this image sensor, the desired object can be satisfactorily achieved.

Examples 1 to 7 of the image sensor will now be described.

EXAMPLES

Figure 6:
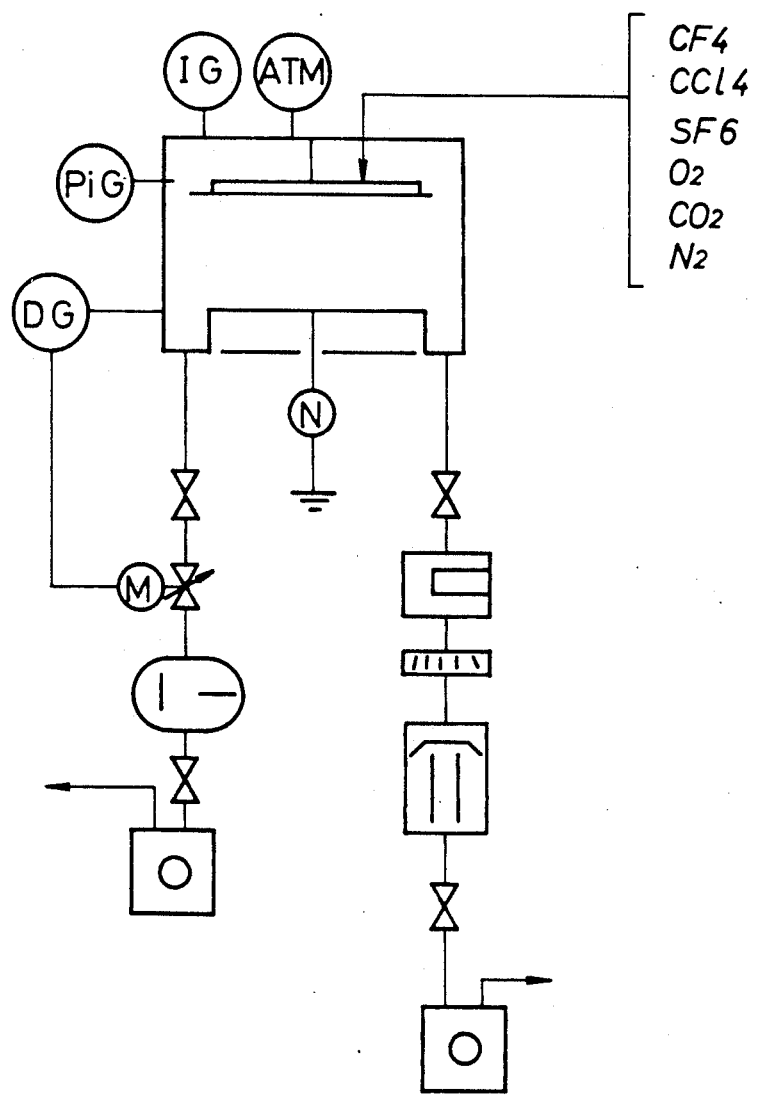
FIG. 6 illustrates a RIE (Reactive Ion Etching) device for use for manufacturing the image sensor according to the present invention.

The examples 1 to 7 are different to each other in the Cr etching conditions, a-Si etching conditions and the number of a-Si layers. For use in these examples, "Pyrex" glass having a thickness of 1 mm, width of 10 mm and length of 250 mm is used as the transparent substrate. Cr employed for the lower electrode is vacuum-vapor deposited on the surface of the Pyrex glass so as to have a film thickness of 1500 Å. Then, the Cr film is, by a dry etching or wet etching, separated into 1728 bits (A4 size) to provide a device density of 8 bits/mm. In this case, the dry etching is performed by using a RIE (Reactive Ion Etching) device shown in FIG. 6 and under the etching conditions designated by symbols A to D shown in Table 2. In FIG. 6, there is shown an ionization gauge IG, a pirani gauge PiG, a baratron gauge DG, and a motor throttle valve M. Under these conditions the end shape of the Cr film has a surface inclined by 1020 to 60°. On the other hand, a etching is performed at room temperature . by using an etching water solution of $CS(NH_4)_2(NO_3)_6$:acetic acid:water=4:1:20. In this case, the end shape of Cr film is in an overhang state in which the upper surface of Cr projects.

As the amorphous silicon layer, a-Si:H, a-SiOH, and P+a-Si:O:H (when the number of the layers is three) layers are, in the above-described sequential order, stacked by a plasma CVD method on the Cr film which has been separated into a multiplicity of elements by a plasma CVD method, with thicknesses of 1.75 μm, 300 Å, and 350 Å, respectively. Then, the thus-layered amorphous silicon layer is, similarly to the Cr film, separated into 1728 bits (A4 size) so as to provide the device density of 8 bits/mm by the dry etching method or the wet etching method. The dry etching is performed by using the RIE device shown in FIG. 6 under the dry etching conditions designated by symbols a to d shown in Table 3.

Figure 7A:
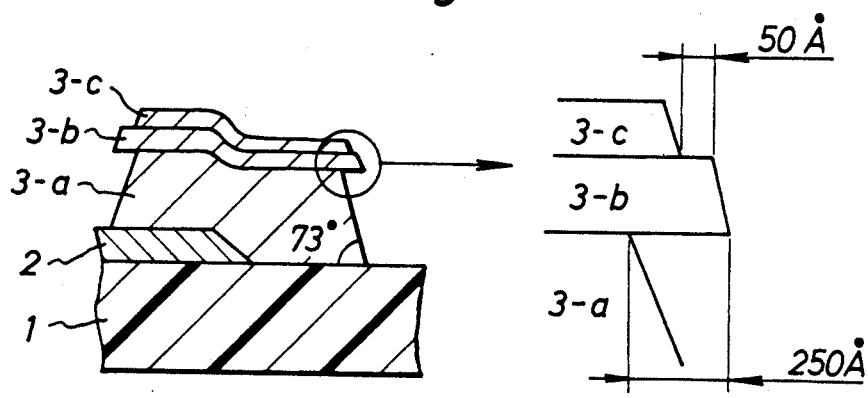
FIG. 7 illustrates the change of the edge shape depending upon the etching conditions.

A variety of end shapes of the amorphous silicon layer after it has been subjected to the etching are shown in FIGS. 7a, 7b, 7c, and 7d. FIG. 7a illustrates the end shape of the amorphous silicon formed by the etching performed under the condition A shown in Table 3. The angle of inclination of the end portion of the amorphous silicon layer is substantially 70°, and the distance between each edge of the a-Si:H layer 3-a and that of the a-Si:O:H layer 3-b is substantially 250 Å. The horizontal distance between an end face of the P+a-Si:O:H layer 3-c and an end face of the a-Si:O:H layer 3-b is substantially 50 Å.

FIG. 7-b illustrates the end shape of the amorphous silicon layer after it has been subjected to the etching performed under the condition B. The angle of inclination of the end portion of the amorphous silicon layer is substantially 60°, and the horizontal distance between the end face of the a-Si:O:H layer 3-b and an end face of the a-Si:H layer 3-a is substantially 100 Å and the horizontal distance between the end face of the P+a-Si:O:H layer 3-c and the end face of the a-Si:O:H layer 3-b is 20 Å or less.

Next, ITO which is used as the transparent conductive film is layered on the amorphous silicon layer by the RF spatter method with the thickness of 750 Å. After the layer has been formed, it is separated into a multiplicity of elements to provide a device density of 8 bits/mm, namely, 1728 bits (A4 size) by wet etching method similarly to the case of the Cr film and the amorphous silicon layer.

Next, the Al film as the upper electrode is vapor deposited by vacuum vaporization with a thickness of 1500 Å. Then, the Al film is separated, similarly to the case of amorphous silicon layer and ITO to a 8 bit/mm density.

Finally, SiON as the transparent insulating film is, by the plasma CVD method, layered to a 1 μm thickness and the image sensor according to the present invention is completed. The film-forming conditions are shown in Table 1.

In each of the examples 2 to 5 and 7, a plurality of image sensors each having individual end shapes of the Cr film and amorphous silicon layer are manufactured for trial.

These examples 1 to 7 will now be described in detail.

TABLE 1

Film Forming Conditions

| | | Film Forming Method | Film Thickness (Å) | Gas | | Flow (SCCM) | Pressure (Torr) | RF Power (W) | Temperature of Substrate (°C.) |
|---|---|---|---|---|---|---|---|---|---|
| Lower Electrode Cr | | Vacuum vapor deposition | 1500 | — | | — | $2 \times 10^{-5}$ | — | 150 |
| Amorphous Silicon Layer | a-Si:H | Plasma CVD | 17500 | $SiH_4/H_2$ | 20% | 100 | 1.0 | 20 | 250 |
| | a-Si:O:H | Plasma CVD | 300 | $SiH_4/H_2$ $CO_2$ | 20% | 100 80 | 1.0 | 8 | 250 |
| | P+a-Si:O:H | Plasma CVD | 350 | $SiH_4/H_2$ $CO_2$ $B_2H_6/H_2$ 2000 ppm | 20% | 80 110 76 | 1.0 | 8 | 250 |
| Transparent Conductive Film ITO | | RF Spatter | 750 | $O_2$ Ar | | 1.8 60 | $1 \times 10^{-2}$ | 200 | 250 |
| Upper Electrode Al | | Vacuum vaporization | 1500 | — | | — | $2 \times 10^{-5}$ | — | 150 |
| Transparent Insulating Film a-SiON | | Plasma CVD | 10000 | $SiH_4$ $N_2$ $CO_2$ | 100% | 10 150 50 | 1.0 | 100 | 250 |

FIG. 7-c illustrates the end shape of the amorphous silicon layer after it has been subjected to the etching performed under the condition C. The angle of inclination of the end portion of the amorphous silicon layer is substantially 45°, and the horizontal distance between the end face of the a-Si:O:H layer 3-b and the end face of the a-Si:H layer 3a is substantially 50 Å and the horizontal distance between the end face of the P+a-Si:O:H layer 3-c and the end face of the a-Si:O:H layer 3-b is substantially less than 50 Angstroms.

FIG. 7-d illustrates the end shape of the amorphous silicon layer after it has been subjected to the etching performed under the condition D. The angle of inclination of the end portion of the amorphous silicon layer is substantially 25°, the a-Si:O:H layer 3-b is retracted with respect to the edge of the a-Si:H layer 3-a, and the distance between the edges is substantially 50 Å. The wet etching is performed by using an etching solution of hydrofluoric acid:nitric acid:acetic acid = 1:4:3, at room temperature. In this case, the obtained end shape of the amorphous silicone has a substantially vertical shape.

TABLE 2

Dry Etching Conditions of Lower Electrode

| RIE Condition | GAS Flow (SCCM) | | | Pressure (Torr) | RF power (W) | Angle of End Portion (Degree) |
|---|---|---|---|---|---|---|
| | $CCl_4$ | $SF_6$ | $O_2$ | | | |
| A | 10 | 10 | — | 0.10 | 250 | 60 |
| B | 15 | — | 5 | 0.05 | 250 | 42 |
| C | 25 | — | 20 | 0.05 | 250 | 29 |
| D | 25 | — | 20 | 0.03 | 300 | 11 |

TABLE 3

Dry Etching Conditions of the Amorphous Silicon Layer

| RIE Condition | GAS Flow (SCCM) | | | | Pressure (Torr) | RF power (W) | Angle of End Portion (Degree) |
|---|---|---|---|---|---|---|---|
| | $CCl_4$ | $CF_4$ | $SF_6$ | $O_2$ | | | |
| a | 5 | 20 | 10 | 5 | 0.10 | 300 | 73 |
| b | 2 | 10 | 10 | 10 | 0.05 | 300 | 60 |
| c | — | 15 | 15 | 10 | 0.05 | 300 | 45 |
| d | — | 20 | — | 15 | 0.05 | 250 | 25 |
| e | — | — | 10 | 10 | 0.05 | 300 | 75 |

TABLE 3-continued

Dry Etching Conditions of the Amorphous Silicon Layer

| RIE Condition | GAS Flow (SCCM) | | | | Pressure (Torr) | RF power (W) | Angle of End Portion (Degree) |
|---|---|---|---|---|---|---|---|
| | $CCl_4$ | $CF_4$ | $SF_6$ | $O_2$ | | | |
| f | — | — | 15 | 5 | 0.05 | 300 | 75 |

TABLE 4

Etching Conditions of Amorphous Silicon layer according to Examples 1 to 7

| Number of Amorphous Silicon Layers | Etching Conditions | Cr etching conditions | | | | Wet Etching |
|---|---|---|---|---|---|---|
| | | A | B | C | D | |
| Two | c | | Example 1 | | | / |
| Three | a | | Example 2 | | | / |
| | b | | Example 3 | | | / |
| | c | | | | Example 4 | |
| | d | | Example 5 | | | / |
| | Wet Etching | / | / | / | / | Example 6 |
| Three | d | / | Example 7 | / | / | / |
| | b | | | | | |
| | e | | | | | |
| | f | | | | | |

Example 1

Example 1 shows a case where the amorphous silicon layer has double layered structure of an a-Si:H layer and an a-Si:O:H layer.

Figure 8A:
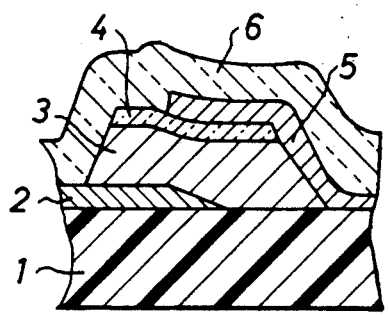
FIGS. 8 to 13 illustrate examples 1 to 6 of the image sensor.

The cross-sectional view of the image sensor is shown in FIG. 8i a.

Figure 8B:
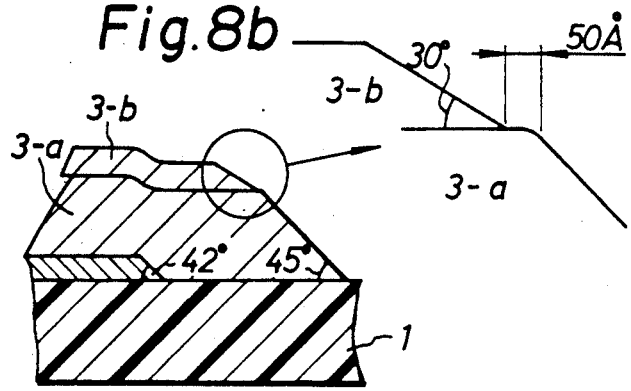

Cr is vapor deposited on the pyrex glass 1, and then it is processed to have the angle of inclination of about 45° at an end portion thereof by the dry etching condition B shown on Table 2. Next, the a-Si:H layer 3-a of 1.75 μm thickness and the a-Si:O:H layer 3-b of 600 Å thickness are successively layered under the film forming conditions shown in Table 1. Then, the thus-layered amorphous silicon layer is processed under the etching condition c shown in Table 3. As shown in FIG. 8b, the angle of inclination of the end portion of the a-Si:H layer 3-a is 45°, while that of the a-Si:O:H layer 3-b is 30°. The a-Si:O:H layer is retracted from the a-Si:H layer by substantially 50 Å to form a smooth step like shape. Finally, the transparent conductive film 4, upper electrode 5, transparent insulating film 6 are formed successively to complete the image sensor.

Example 2

Figure 9:
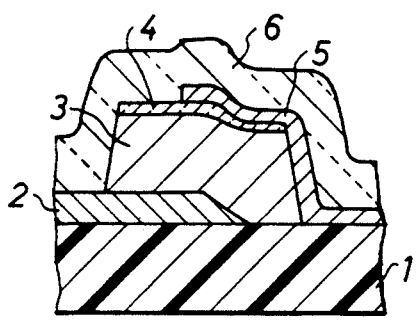

The cross-sectional view of the image sensor is shown in FIG. 9. Cr 2 is vapor deposited on the pyrex glass 1, and the Cr film is separated into a multiplicity of elements to provide a device density of 8 bit/mm by using the RIE device shown in FIG. 6 in which a mixture gas of $CF_4$, $SF_6$ and $O_2$ as the etching gas is used under the etching conditions A to D shown in Table 2. Four types of Cr films each having the angle of inclination at the end portion within the range of from 10° to 60° are made. Under the film forming conditions shown in Table 1, the a-Si:H, a-Si:OH, and $P^+$a-Si:OH layers constituting the amorphous silicon layer 3 are successively layered. After they have been layered, the RIE device shown in FIG. 6 is used to achieve the end shape of the amorphous silicon layer as shown in FIG. 7a on each Cr film under the dry etching condition shown in Table 3. Finally, under the film forming conditions shown in Table 1, the transparent conductive film 4, the upper electrode 5, and the transparent insulating film 6 are layered so as to complete the image sensor.

Example 3

Figure 7B:
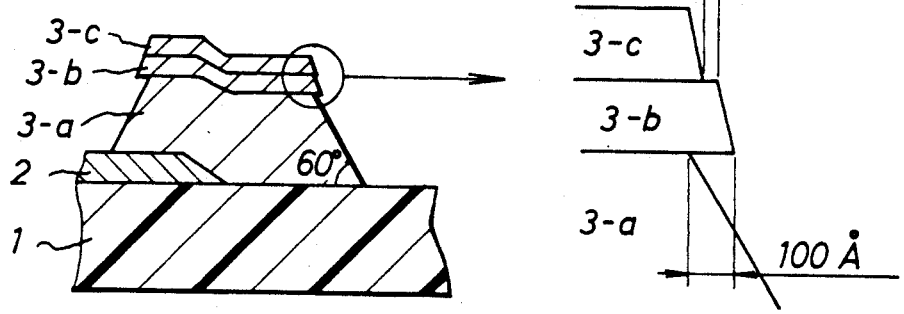
Figure 10:
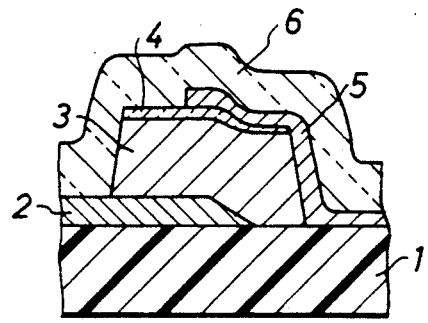

The cross-sectional view of the image sensor is shown on FIG. 10. Cr 2 is vapor deposited on the surface of the pyrex glass 1, the Cr film is separated to provide a device density of 8 bit/mm by using the RIE device under the dry etching conditions A to D shown in Table 2. Then, four types of Cr films each having a different angle of inclination at the end portion thereof within the range of from 10° to 60° are made under the above-described conditions. Next, under the film forming conditions shown in Table 1, the amorphous silicon layer 3 is layered. The amorphous silicon layer is processed to have the shape of the end portion thereof as shown in FIG. 7b on each of the above-described four types of Cr films under the dry etching condition b shown in Table 3.

Finally, under the film forming conditions shown in Table 1, the transparent conductive film 4, the upper electrode 5, and the transparent insulating film 6a are formed on each of the amorphous silicon layer so as to complete the image sensor.

Example 4

Figure 11:
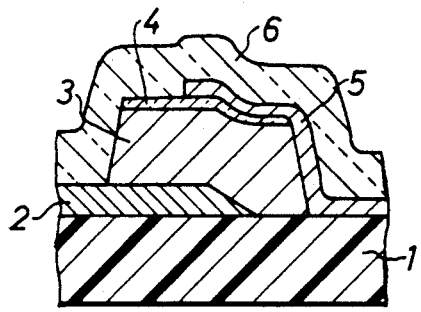

The cross-sectional view of the image sensor is shown in FIG. 11. Cr is vapor deposited on the pyrex glass 1, and the thus-obtained Cr film is separated to provide a device density of 8 bit/mm under the dry etching conditions A to D shown in Table 2, and using a wet etching water solution of $CS(NH_4)_2(NO_3)_6$ of 180 cc, acetic acid of 48 cc, and water of 1000 cc. Five types of Cr films are made, four of which each having an angle of inclination at the end portion thereof within the range of from 10° to 60°, and the other one having that in an overhang state.

Figure 7C:
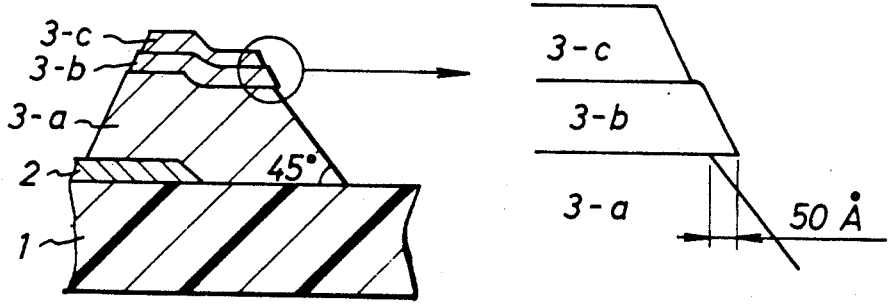

Under the film forming conditions shown in Table 1, the amorphous silicon layer is layered. After that, an amorphous silicon layer is layered to have the end shape as shown in FIG. 7c under the dry etching condition c, shown in Table 3, on each of the five types of Cr films.

Finally, under the conditions shown in Table 1, the transparent conductive film 4, the upper electrode 5, and the transparent insulating film 6 are formed to complete the image sensor.

Example 5

Figure 12:
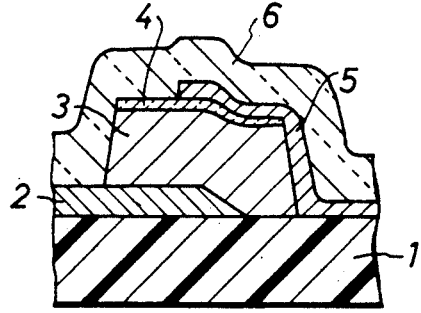

The cross-sectional view of the image sensor device is shown in FIG. 12. Cr 2 is vapor deposited on the pyrex glass 1. Then, the Cr film is separated to provide a density device of 8 bit/mm under the dry etching conditions A to D shown in Table 2. Four types of Cr films each having an angle of inclination at the end portion thereof within the range of from 10° to 60° are made under the film forming conditions shown in Table 1.

Next, under the film forming conditions shown in Table 1, the amorphous silicon layer 3 is layered. After that, under the dry etching condition d shown in Table 3, the amorphous silicon layer is processed to have the shape of an end portion thereof as shown FIG. 7d on each of the four types of the Cr films.

Finally, the transparent conductive film 4, the upper electrode 5, and the transparent insulating film 6 are formed on each of the amorphous silicon layers under the film forming conditions shown in Table 1 to complete the image sensor.

Example 6

Figure 13:
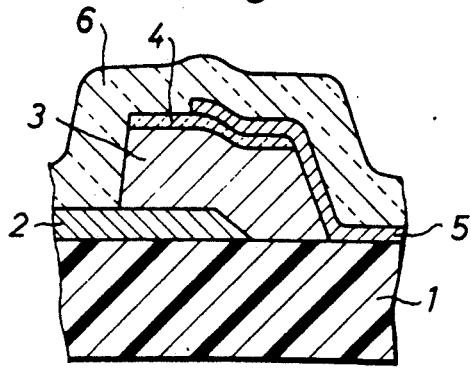

The cross sectional view of the image sensor device is shown in FIG. 13. Cr 2 is vapor deposited on the pyrex glass 1. Then, the Cr film is separated to provide a device density of 8 bit/mm by the wet etching method by using an etching water solution of $CS(NH_4)_2(NO_3)_6$ of 180 cc, acetic acid of 48 cc and water of 1000 cc. The shape of the end portion of the Cr film is in an overhang state after the wet etching has been performed. Then, under the film forming conditions shown in Table 1, the amorphous silicon layer 3 is layered. After that, layer 3 is separated by the wet etching method by using an etching solution of hydrofluoric acid:nitric acid:acetic acid = 1:4:3. The shape of the end portion of the amorphous layer is in an overhang state.

Finally, the transparent conductive film 4, the upper electrode 5, and the transparent insulating film 6 are formed under the film forming conditions shown in Table 1 to complete the image sensor.

Example 7

The cross-sectional views of the image sensors are shown in FIGS. 15a, 15b, 15c, and 15d. In each of them, Cr is vapor deposited on the pyrex glass 1, and the Cr film is separated into a multiplicity of elements to provide a device density of 8 bit/mm by using the RIE device shown in FIG. 6 under the RIE condition B shown in Table 2. In this case, the Cr film 2 is processed to have the angle of about 40° at an end portion thereof.

Next, the a-Si:H layer 3-a, a-Si:O:H layer 3-b, and P+a-Si:O:H layer are successively layered under the film forming conditions shown in Table 1. The thus-layered amorphous silicon layer is processed under the etching conditions d, b, e, and f shown in Table 3 to form four kinds of image sensors.

In the RIE condition d, $CF_4$ (20 sccm) and $O_2$ (15 sccm) are used as the etching gas, and the gas pressure is kept at 0.05 Torr during the etching.

Under this condition, the resist 7 is etched easily.

Figure 15A:
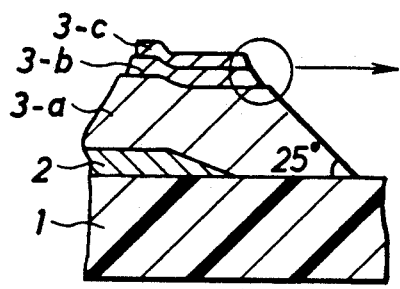
FIGS. 15a to 15d illustrate example 7 of the image sensor.
Figure 15A:
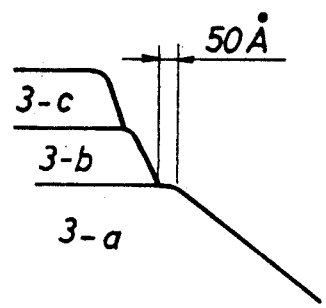
Figure 17A:
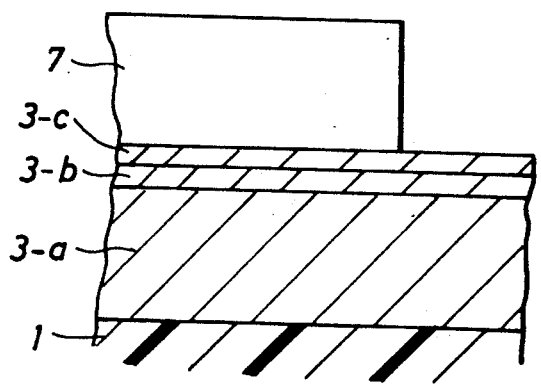
FIGS. 17a and 17b illustrate the progress of etching by the etching gas of $CF_4$ plus $O_2$.
Figure 17B:
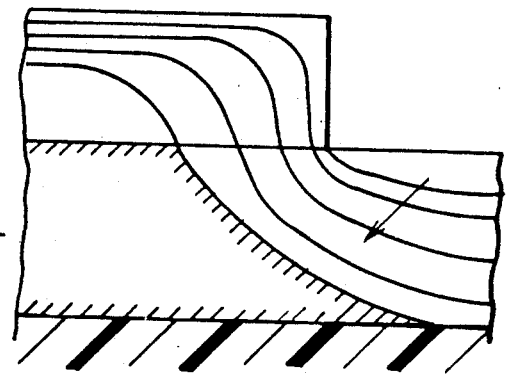

Since the resist 7 is etched and retracted as shown in FIGS. 17a and 17b, the amorphous silicon layer having the smooth step-like shape shown in FIG. 15a is obtained.

In the RIE condition b, $CCl_4$ (2 sccm), $CF_4$ (10 sccm), $SF_6$ (10 sccm), and $O_2$ (10 sccm) are used as the etching gas, and the gas pressure is kept at 0.05 Torr. Under this condition, since the radical produced during the process of the etching is increased, the etching rate of the amorphous silicon layer is increased.

Figure 15B:
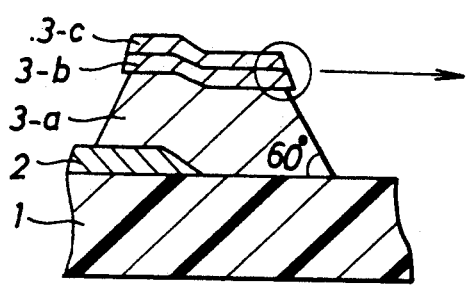
Figure 15B:
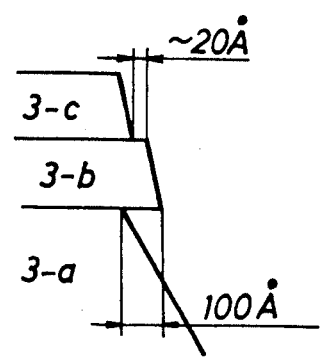

Therefore, the etching of the amorphous silicon layer proceeds under the condition that the resist 7 retracts insufficiently, and the difference in the etching rate between the a-Si:H layer and the a-Si:O:H and P+a-Si:O:H layers increases. As a result, the amorphous silicon layer having an eaves-like shape in which the a-Si:O:H layer juts out by 100 Å as shown in FIG. 15b is obtained.

Figure 15C:
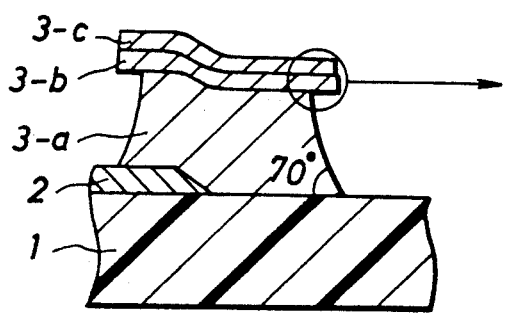
Figure 15C:
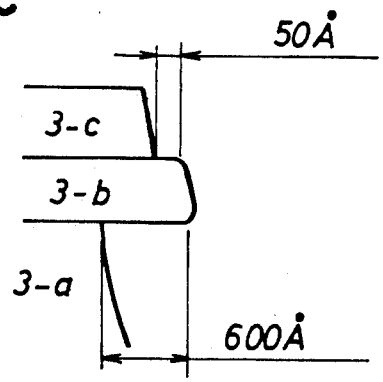
Figure 15D:
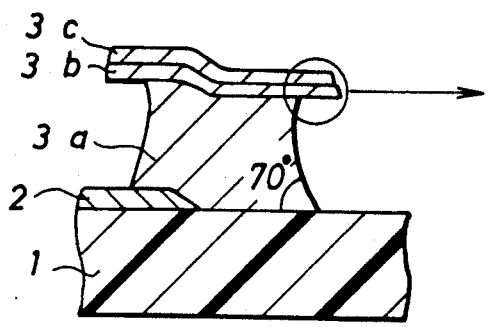
Figure 15D:
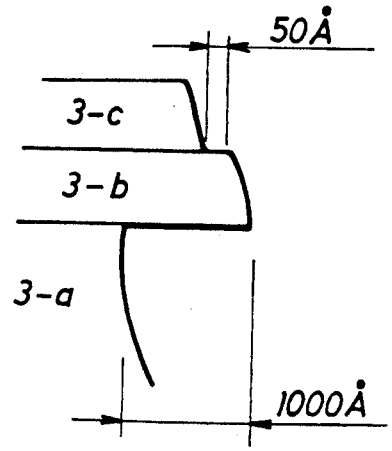
Figure 16A:
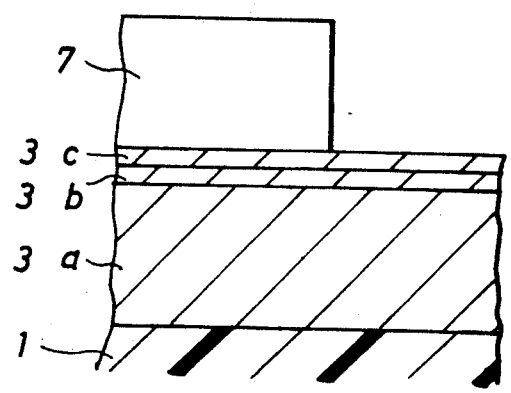
FIGS. 16a and 16b illustrate the progress of etching by the etching gas of $SF_6$ plus $O_2$.
Figure 16B:
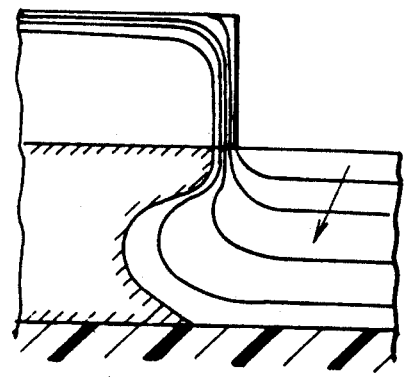

In the RIE condition e, $SF_6$ (10 sccm) and $O_2$ (10 sccm) are used as the etching gas, and the gas pressure is kept at 0.05 Torr. Under this condition, the selection ratio of the amorphous silicon layer with respect to the resist is large, and the etching of the amorphous silicon layer proceeds under the condition that the resist is hardly retracted. Therefore, the difference in the etching rate between the a-Si:H layer and the a-Si:O:H and P+a-Si:O:H layer increases remarkably as shown in FIGS. 16a and 16b. As a result, the amorphous silicon layer having an eaveslike shape in which the a-Si:O:H layers juts out by 600 Å as shown in FIG. 15c is obtained.

In the RIE condition f, $SF_6$ (15 sccm) and $O_2$ (5 sccm) are used as the etching gas, and the gas pressure is kept at 0.05 Torr. Under this condition, the phenomenon occuring in the etching under the above-described RIE condition e is enlarged, and the amorphous silicon layer having an eaveslike shape in which the a-Si:O:H layer juts out by 1000 Å is obtained.

Finally, the transparent film 4 of ITO, upper electrode 5 of Al, and transparent insulating film 6 of SION are formed successively on each of the above-mentioned four types of amorphous layers to complete the image sensor.

The evaluation of the characteristics of the image sensors of these examples 1 to 7 will now be described. Following two factors are subjects of this evaluation.
1. Step coverage of SiON film.
2. Disconnection of the upper electrode.

The evaluating method will be described below.

1. Step Coverage of SiON Film

SiON employed for the insulating film serves as a protection film for the image sensor. Therefore, it is required that the coverage performance of the SiON film is excellent so that the characteristics of the image sensor are stable for a long period of time. As described above, the SiON film disposed at the highest position of the multilayered image sensor tends to be influenced by the shapes of the end portions of the Cr film and amorphous silicon layer disposed in the lower portion of the image sensor. Therefore, the step coverage state of the SiON film for each of the image sensors each having individual end shapes of the Cr film and the amorphous silicon layer has been checked by observing cross sections of the image sensor by using an SEM (Scanning Electron Microscope).

2. Disconnection of the Upper Electrode (Al)

Figure 14:
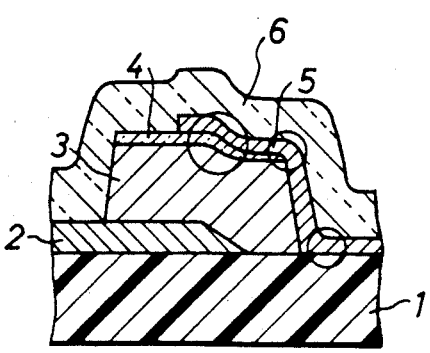
FIG. 14 illustrates a disconnection portion in Al film which serves as the upper electrode.

An Al film employed for the upper electrode is easily broken in portions surrounded by circles shown in FIG. 14. In order to obtain a high quality image sensor, it is required to prevent a break or a disconnection of the Al wiring. Therefore, the disconnection of the Al wiring has been checked for each of the image sensors each having individual end shapes of the Cr film and the amorphous silicon layer.

The result of the evaluation is shown by the ratio of the number of devices in which the disconnection occurred to the total number of the devices (1728 bits) by %. The result of the evaluation for the above-described two factors are shown in Table 5, wherein symbols ⊙ represents excellent, O represents good, Δ represents tolerable, and x represents no good.

Figure 7D:
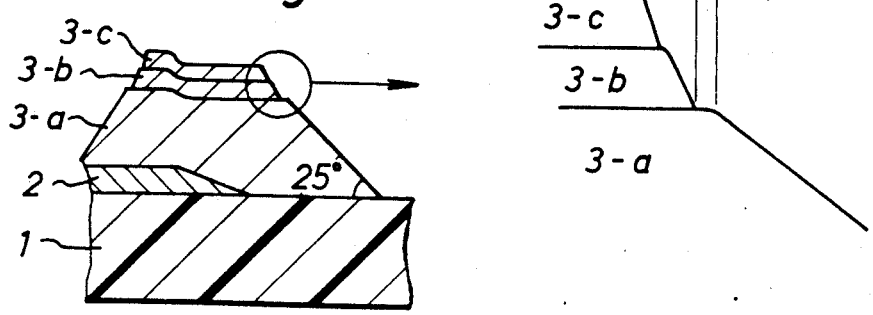

As seen from Table 5, the dry etching method is superior to the wet etching method in etching the Cr film and amorphous silicon layer. Furthermore, an image sensor having an excellent step coverage and no disconnection of the Al film by making the angle of inclination at the end portion of the Cr film is within the range of from 15° to 45°, preferably less than 30°, and making the shape of the end portion of the amorphous silicon layer as shown in FIG. 7c or FIG. 7d.

TABLE 5

| Shape of end portion of amorphous silicon layer | | Angle of inclination at end portion of Cr film (degree) | State of SiON step coverage | Disconnection of Al wiring (%) |
|---|---|---|---|---|
| Example 1 | | 40 | ○ | 0.6 |
| Example 2 | | 10 | X | 16.0 |
| | | 30 | X | 20.0 |
| | | 40 | X | 15.0 |
| | | 60 | X | 15.0 |
| Example 3 | | 10 | Δ | 0.2 |
| | | 30 | Δ | 2.7 |
| | | 40 | Δ | 2.7 |
| | | 60 | Δ | 2.9 |
| Example 4 | | 10 | ⊚ | 0 |
| | | 30 | ⊚ | 0 |
| | | 40 | ○ | 0.3 |
| | | 60 | Δ | 2.9 |
| | | Overhang | X | 7.5 |
| Example 5 | | 10 | ⊚ | 0 |
| | | 30 | ⊚ | 0 |
| | | 40 | ⊚ | 0 |
| | | 60 | ○ | 0.3 |
| Example 6 (Comparison Ex.) | | Overhang | X | 50.0 |
| Example 7 (Comparison Ex.) | RIE-d (FIG. 15a) | 40 | ⊚ | 0 |
| | RIE-b (FIG. 15b) | | Δ | 2.7 |
| | RIE-e (FIG. 15c) | | X | 81.0 |
| | RIE-f (FIG. 15d) | | X | 100.0 |

Finally, the result of an environmental test using the image sensor of Example 4 having the angle of inclination of 30° at the end portion of the Cr film will now be described.

The change of an electric current in darkness is observed in a case where the above-described type of image sensor has been left being applied with a voltage of 5 V under high temperature of 60° C. and high humidity of 90% for a predetermined period of time. The current just before the test is $4.0 \times 10^{-13}(A)$, while that just after the test is $4.5 \times 10^{-13}(A)$. The value of change is substantially negligible, and no device showing an abnormal function is observed for all of 1728 bits.

Many widely different embodiments of the present invention may be constructed without departing from the spirit and scope of the present invention. It should be understood that the present invention is not limited to the specific embodiment described in the specification, except as defined in the appended claims.

What is claimed is:

1. An image sensor comprising:
   a lower electrode disposed on a surface of a substrate;
   a multilayered amorphous silicon layer covering one end portion of said lower electrode along a longitudinal direction of said lower electrode at one end portion thereof, and disposed on a surface of said substrate at the other end portion thereof; and
   an upper electrode disposed at one end portion thereof on a surface of said other end portion of said amorphous silicon layer and on an end face of said other end portion of said amorphous silicon layer and disposed at the other end portion thereof on said surface of said substrate, said surface of said other end portion of said amorphous silicon layer being opposite to said surface of said substrate,
   an angle between an end face of said one end portion of said lower electrode and said surface of said substrate being within a range of 10° to 60°, an angle between said end face of said other end portion of said amorphous silicon layer and said surface of said substrate being within a range of from 25° to 60°, and a horizontal distance between respective end faces of any two neighboring layers of said multilayered amorphous silicon layer at said other end portion of said amorphous silicon layer being equal to or less than 500 Å.

2. An image sensor according to claim 1, in which at least one layer of said amorphous silicon layer contains oxygen atoms.

3. An image sensor according to claim 2, in which at least one layer of said amorphous silicon layer contains Group III atoms.

4. An image sensor according to claim 1, in which said substrate is transparent.

5. An image sensor according to claim 1, in which said lower electrode comprises a layer formed on said surface of said substrate by vacuum deposition, said amorphous silicon layer comprises a layer formed on a surface of said one end portion of said lower electrode and said surface of said substrate by a plasma CVD method, and said upper electrode comprises a layer formed on said surface of said other end portion of said amorphous silicon layer, said end face of said other end portion of said amorphous silicon layer and said surface of said substrate by vacuum deposition.

6. An image sensor according to claim 5, in which said lower electrode and said amorphous silicon layer are separated into a multiplicity of image sensor devices.

7. An image sensor according to claim 5, in which said upper electrode is covered with a transparent insulating film.

8. An image sensor of claim 7, in which said transparent insulating film comprises $NaAlF_6$, $SiO_2$, $Si_3N_4$, SiON, polyimide or an epoxy insulating resin.

9. An image sensor according to claim 5, in which said amorphous silicon layer comprises two layers.

10. An image sensor according to claim 9, in which said amorphous silicon layer comprises an a-Si:H layer and an a-Si:O:H layer.

11. An image sensor according to claim 5, in which said amorphous silicon layer comprises three layers.

12. An image sensor according to claim 11, in which said amorphous silicon layer comprises an a-Si:H layer, an a-Si:O:H layer and a p+a-Si:O:H layer.

13. An image sensor according to claim 1, in which a transparent conductive film is formed on said amorphous silicon layer.

14. An image sensor according to claim 13, in which said transparent conductive film comprises ITO, $SnO_2$, $In_2O_2$ or $TiO_2$.

15. An image sensor according to claim 1, in which said lower electrode comprises Cr, Mo, Ni, Ti, or Co.

16. An image sensor according to claim 1, in which said upper electrode comprises a monometal thin film comprising Al, Ni, Pt or a Al-Si-Cu alloy thin film.

* * * * *